United States Patent [19]
Araki

[11] Patent Number: 5,345,326
[45] Date of Patent: Sep. 6, 1994

[54] OPTICAL MATRIX SWITCH

[75] Inventor: Soichiro Araki, Tokyo, Japan

[73] Assignee: NEC Corporation, Tokyo, Japan

[21] Appl. No.: 967,849

[22] Filed: Oct. 28, 1992

[30] Foreign Application Priority Data

Oct. 28, 1991 [JP] Japan ................................. 3-281413

[51] Int. Cl.$^5$ ........................ H04B 10/20; H04J 14/02
[52] U.S. Cl. ..................................... 359/117; 359/128
[58] Field of Search ..................... 359/117, 128, 139; 385/16, 17, 24

[56] References Cited

U.S. PATENT DOCUMENTS

| | | | |
|---|---|---|---|
| 4,545,078 | 10/1985 | Weideburg | 359/117 |
| 4,549,313 | 10/1985 | Rozenwaig | 359/117 |
| 4,953,155 | 8/1990 | Tangonan | 359/117 |
| 5,227,906 | 7/1993 | Tokumitsu | 359/139 |

OTHER PUBLICATIONS

A Broadband Optoelelectronic Matrix Switch, Elmer H. Hara, et al., 1980.
Papuchon et al., "Electrically Switched Optical Directional Coupler: Cobra", *Applied Physics Letters*, vol. 27, No. 5, 1975, pp. 289-291.
Hara et al., "A Broadband Optoelectronic Matrix Switch" *The Institute of Electronics Information and Communications Engineers*, OQE 80-90, 1980, pp. 41-46.

*Primary Examiner*—Leslie Pascal

[57] ABSTRACT

An optical matrix switch according to the present invention includes plural demultiplexing and multiplexing light paths, plural optical switching devices each provided on a corresponding one of the plural demultiplexing and multiplexing light paths. The optical switching devices are controlled to be selectively turned on and off.

5 Claims, 4 Drawing Sheets

OPTICAL MATRIX SWITCH

FIELD OF THE INVENTION

This invention relates to an optical matrix switch, and more particularly to, an optical matrix switch by which light-to-light switching is carried out.

BACKGROUND OF THE INVENTION

An optical matrix switch includes one or more optical switches provided on optical waveguides connected to plural light signal input terminals and plural light signal output terminals. In this optical matrix switch, a light signal supplied to one of the input terminals is transmitted to a selected light signal output terminal by controlling the switching operation of the optical switches.

One type of such an optical switch is an optical directional coupler which comprises, for instance, two optical waveguides having two input terminals and two output terminals, and control electrodes for applying an electric field across the optical waveguides, respectively, provided on an optoelectrical crystal substrate such as $LiNbO_3$, $LiTaO_3$, etc. In this optical directional coupler, the switching of a light signal supplied to one of the two input terminals is carried out to be obtained at one of the two output terminals by controlling a voltage applied across the control electrodes.

Another type of an optical matrix switch is described in a report "Wideband optoelectronic matrix switch" included in the technical material OQE80-90, 1980 of "The Institute of Electronics Informations and Communications Engineers". In this optical matrix switch, the signal switching is carried out at a position where a light signal is converted to an electric signal.

A further type of an optical matrix switch is described in a report "Study of tunable optical connection by matrix driving on VSTEP devices" included in the technical material OQE 89-77, 1989 of "The Institute of Electronics Information and Communications Engineers". In this optical matrix switch, the signal switching is carried out at a position where an electric signal is converted to an optical signal.

According to the above three types of the optical matrix switches, however, there are disadvantages as set out below.

In the first optical matrix switch, high fabrication precision is required to decrease cross-talk tending to occur in normal operation, and a control voltage is required to be as high as 40 to 50 V.

In the second optical matrix, an electric output signal is required to be converted to an optical signal so as to realize the switching of light to light.

In the third optical matrix switch, an optical input signal is required to be converted to an electric signal so as to realize the switching of light to light.

As a result, the optical matrix switches of the second and third types become large in size, and low in operation speed.

SUMMARY OF THE INVENTION

Accordingly, it is an object of the invention to provide an optical matrix switch for light-to-light switching, which is small in size and operates at high speed.

It is a further object of the invention to provide an optical matrix switch in which a switching voltage is lowered, and cross-talk is suppressed.

According to the invention, an optical matrix switch, includes:

plural input light paths, to which one or more input light signals are supplied;

plural output light paths, from which one or more output light signals are supplied to a following stage;

plural demultiplexing and multiplexing light paths, each of the plural demultiplexing and multiplexing light paths being connected to a corresponding one of the plural input light paths and a corresponding one of the plural light output paths;

plural optical switching devices each provided on a corresponding one of the plural demultiplexing and multiplexing light paths; and means for controlling the plural optical switching devices to be selectively turned on and off;

wherein one or more optical switching devices which are selectively turned on among the plural optical switching devices emit light signals to be supplied to one or more output light paths of the plural output light paths by receiving and amplifying one or more light signals from one or more input light paths of the plural input light paths; and one or more optical switching device which are selectively turned off among the plural optical switching devices emit no light signal by receiving and absorbing one or more light signal from one or more input light paths of the plural input light paths.

The other objects and features of this invention will become understood from the following description with reference to the accompanying drawings.

DESCRIPTION OF THE PREFERRED EMBODIMENTS

For a better understanding of the background of the present invention, the basic principle of the conventional technology is first described hereinafter with reference to FIG. 1.

Figure 1:
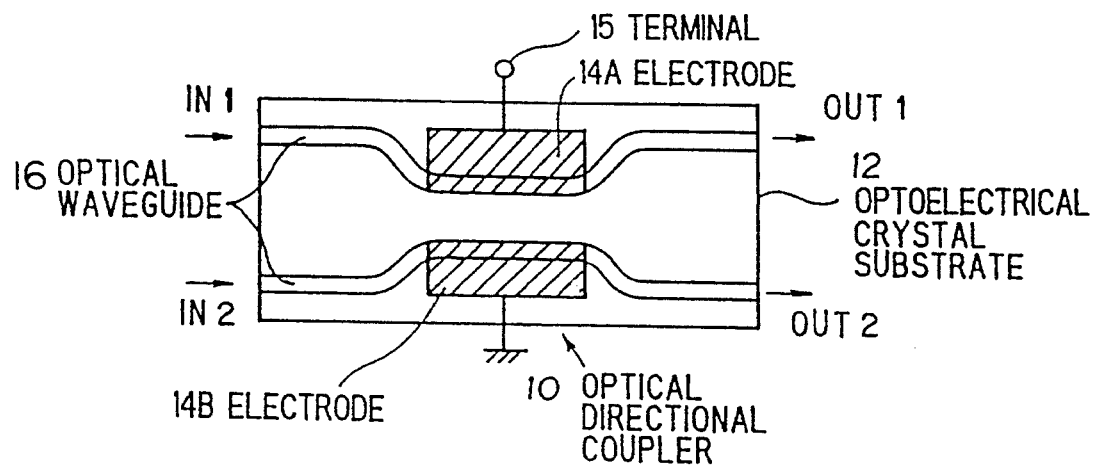
FIG. 1 is a schematic view illustrating conventional optical matrix switch.

FIG. 1 shows an optical directional coupler 10 which includes electrodes 14A and 14B provided on an optoelectrical crystal substrate 12 of $LiNbO_3$, $LiTaO_3$, etc., and optical waveguides 16 formed on the substrate 12 by diffusion of Ti into the substrate 12.

The electrode 14A is connected to a terminal 15 which is applied with a control voltage, and the electrode 14B is connected to ground, so that a control led electric field is applied across the narrow portion of the parallel optical waveguides 16.

In operation, an input light applied to an input terminal $IN_1$ is switched to be supplied from an output terminal $OUT_1$ or $OUT_2$ in accordance with the value of the control voltage applied to the terminal 15. In the same manner, an input light supplied to an input terminal $IN_2$ is switched to be obtained at the output terminal $OUT_1$ or $OUT_2$ as an output light.

According to the conventional optical matrix switch, however, there are disadvantages in that the matrix switch must be fabricated with high precision to reduce crosstalk occurring therein, and high voltage, around 40V to 50V, is required to be applied to the electrode 14 of the optical directional coupler 10. The second and third conventional optical matrix switches are not explained here.

Figure 2:
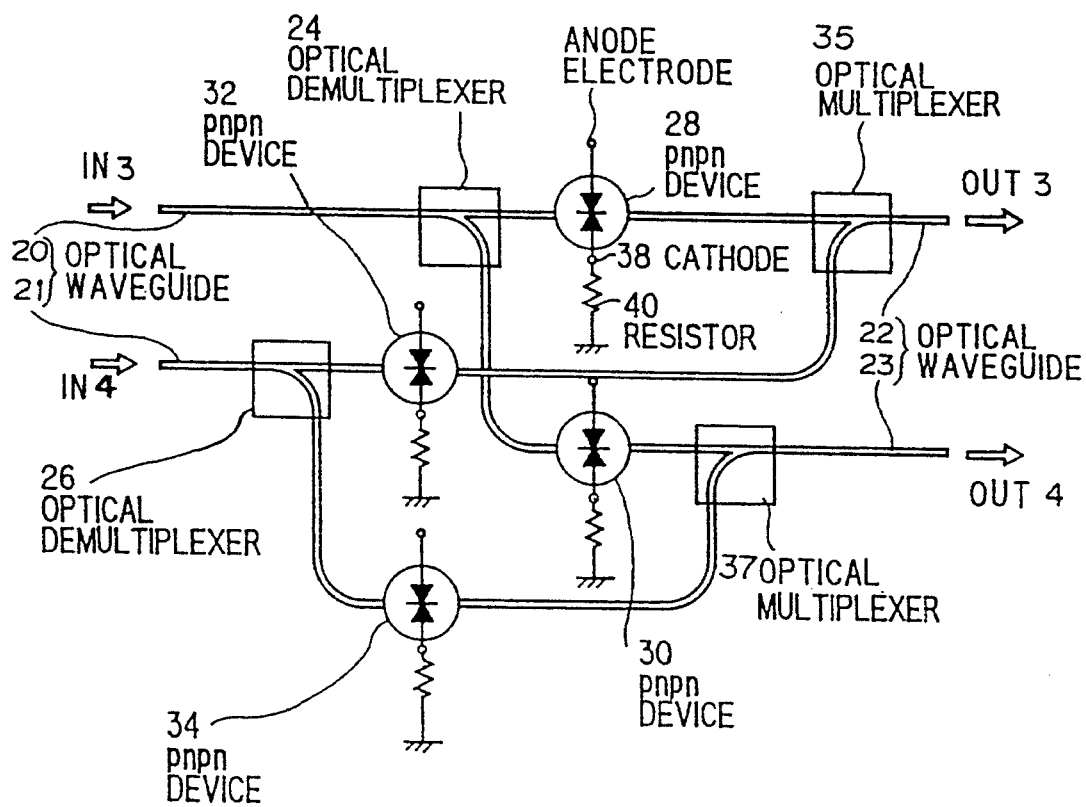
FIG. 2 is a schematic view illustrating a optical matrix switch of a preferred embodiment according to the invention.
Figure 3:
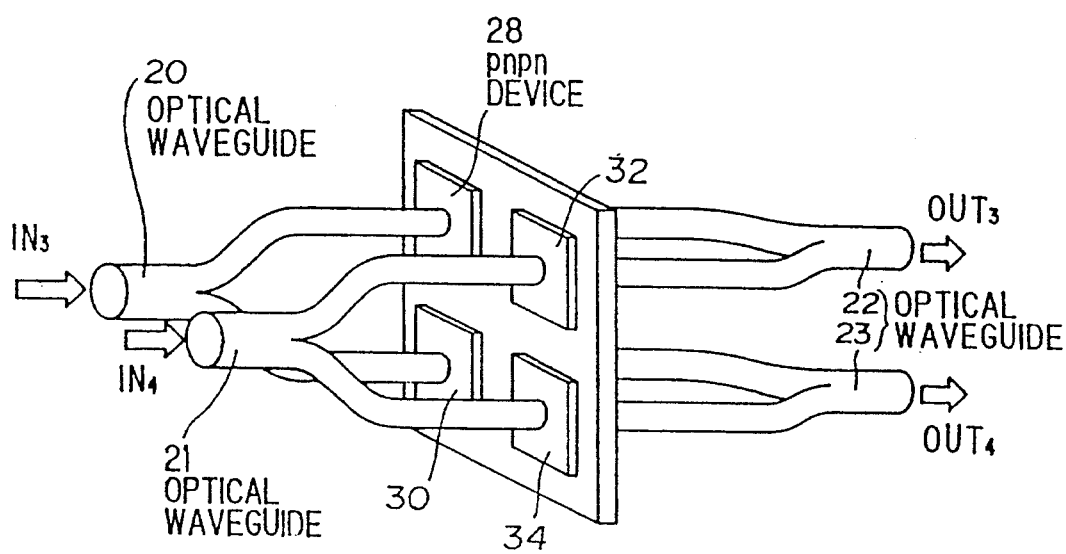
FIG. 3 is a perspective view illustrating the preferred embodiment.
Figure 4:
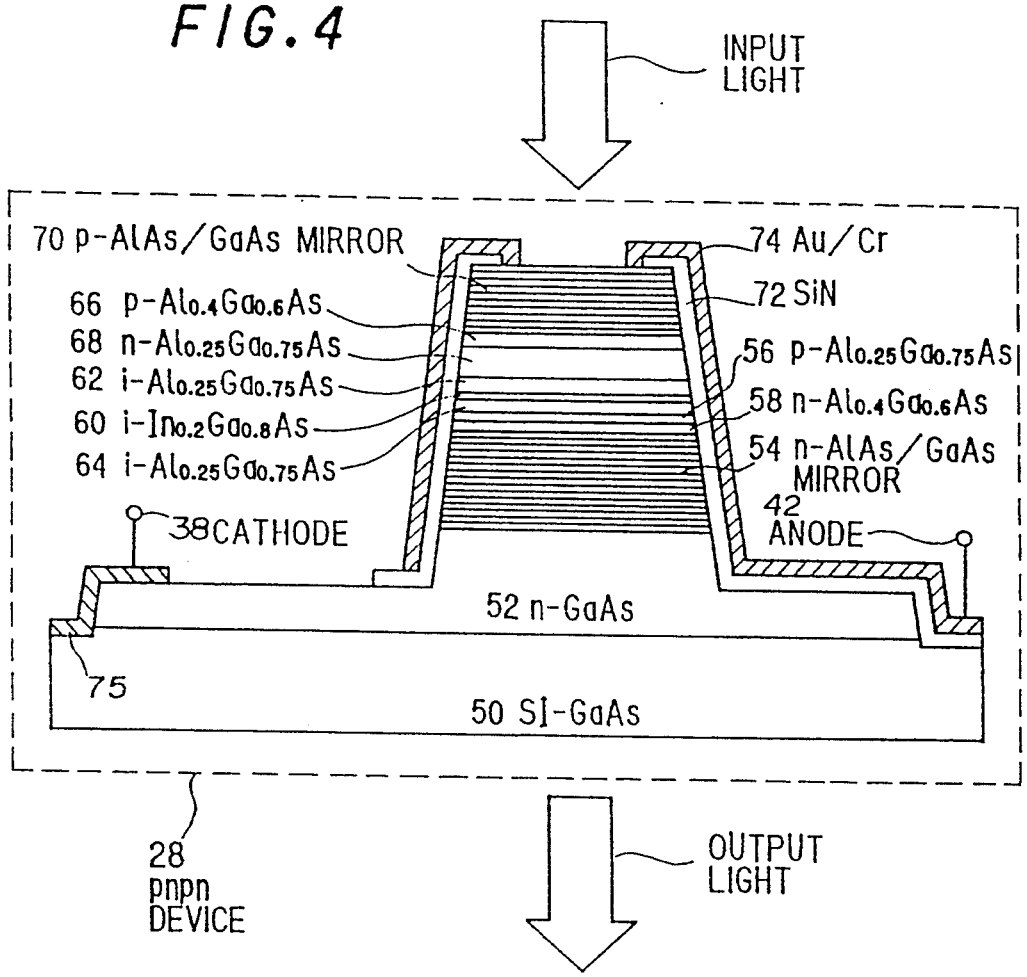
FIG. 4 is a cross-sectional view illustrating a device used for the preferred embodiment.
Figure 5:
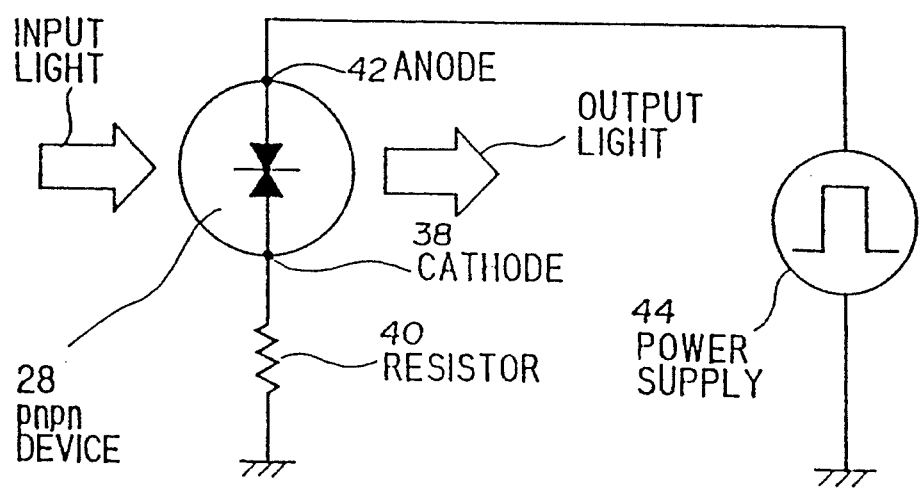
FIG. 5 is a schematic view used to show operation of the device shown in FIG. 4.

FIGS. 2 and 3 show a optical matrix switch of a preferred embodiment according to the invention. The optical matrix switch, which is of two-input and two-output type, includes optical waveguides 20 and 21 having input terminals $IN_3$ and $IN_4$ to which input lights are supplied, optical demultiplexers 24 and 26 for demultiplexing lights of the optical waveguides 20 and 21, optical multiplexers 35 and 37 for multiplexing the demultiplexed lights, pnpn (more precisely "pn-i-pn") devices 28, 30, 32 and 34 respectively positioned between one of the optical demultiplexers 24 and 26 and one of the optical multiplexers 35 and 37, and optical waveguides 22 and 23 connected to the optical multiplexers 35 and 37 having output terminals $OUT_3$ and $OUT_4$ from which output lights are supplied. FIG. 4 shows the pnpn device 28, and FIG. 5 shows a circuit for explaining electrical connection of the pnpn device 28. In these figures, the pnpn device 28 is exemplarily shown, because each of the other devices has the same structure as the device 28.

The pnpn device 28 is connected at a cathode 38 to a load resistor 40 connected to ground, and at an anode 42 to a power supply 44.

The pnpn device 28 includes an SI(semi-insulating)-GaAs substrate 50, an n-GaAs layer 52 formed on the SI-GaAs substrate 50, an n-AlAs/GaAs mirror layer 54 formed on the n-GaAs layer 52, a first pn layer formed on the mirror layer 54 and composed of a p-$Al_{0.25}Ga_{0.75}As$ layer 56 and an n-$Al_{0.6}As$ layer 58, an active layer 60 of i-$In_{0.25}Ga_{0.75}As$ layer, two cladding layers 62 and 64 of i-$Al_{0.25}Ga_{0.75}As$ each having the forbidden band width broader than that of the active layer 60, which sandwich the active layer 60, a second pn layer formed on the active layer and composed of a p-$Al_{0.25}Ga_{0.75}As$ layer 66 and an n-$Al_{0.4}Ga_{0.6}As$ layer 68, a p-AlAs/-GaAs mirror layer 70 formed on the second pn layer (66 and 68), an SiN layer 72 covering the surface of the structure, an Au/Cr electrode 75 connected to a cathode terminal 38, and an Au/Cr electrode 74 connected to an anode terminal 42.

The mirror layers 54 and 70 are fabricated by alternately forming AlAs layers and GaAs layers. The first and second pn layers are for optical thyristor structure.

Figure 6:
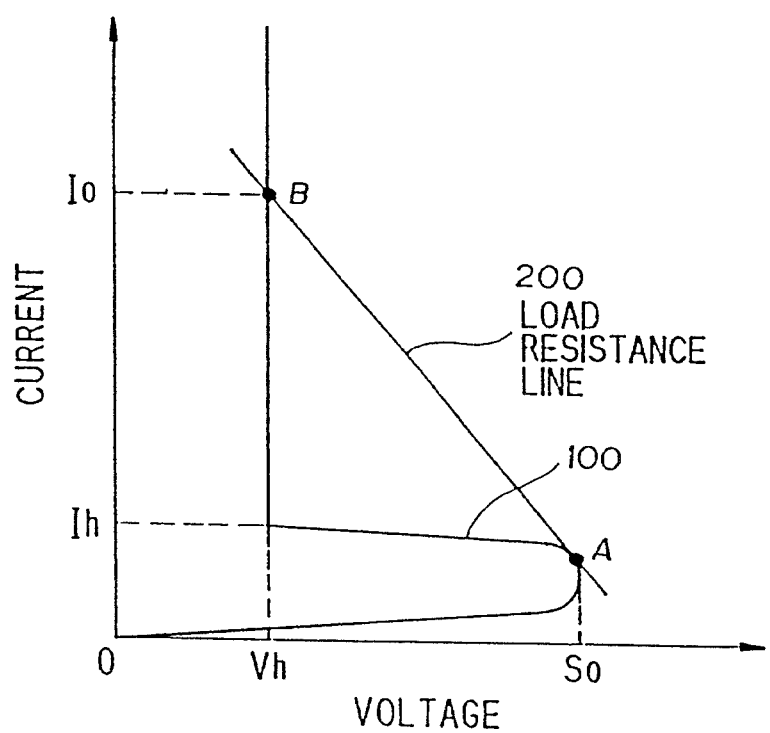
FIGS. 6 and 7 are graphs showing operation of the device in FIG. 4, respectively.

In the pnpn device 28, when a voltage applied across the anode and cathode terminals 42 and 38 is raised on condition that no input light is supplied to the pnpn device 28, current flowing through the pnpn device 28 is varied as shown in FIG. 6.

Thus, a current-voltage characteristic 100 having intersecting points A and B with a load resistance line 200 which is defined by a resistance of the load resistor 40 and a voltage of the power supply 44 is obtained. As a voltage applied across the pnpn device 28 becomes a level $S_0$, at which the curve 200 intersects with the line 100 to provide the operation point A, the pnpn device 28 is turned on, so that a voltage across the pnpn device 28 and a current flowing therethrough change along the curve 100. As the flowing current increases to a level $I_0$, the curve 100 intersects with the line 200 to provide the operation point B, at which operation of the pnpn device 28 is stably maintained.

Figure 7:
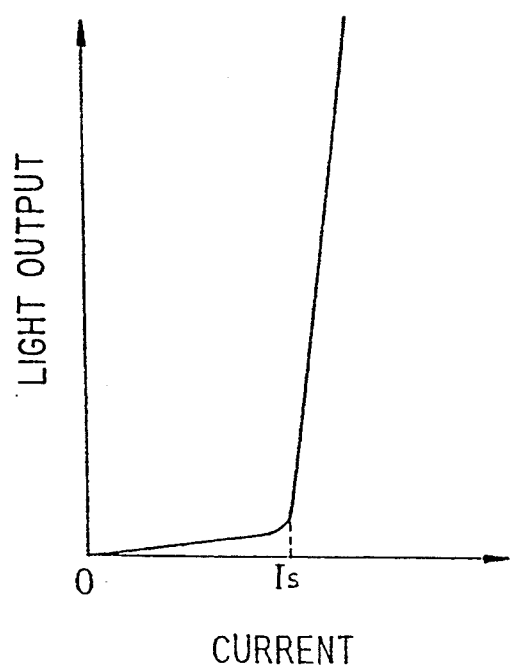

FIG. 7 shows a current-light output characteristic of the pnpn device 28, wherein it is shown that, when a current flowing through the pnpn device 28 is over a threshold value $I_s$, the pnpn device 28 emits light in accordance with the induced emission mode.

In accordance with those characteristics of the pnpn device 28, the optical matrix switch of the preferred embodiment is structured, such that each of the pnpn devices 28, 30, 32 and 34 is controlled to be turned on and off by a voltage applied thereto. In a turned-on pnpn device, the current $I_0$ is controlled to be slightly lower in level than the threshold value $I_s$ by setting the resistance of the load resistor 40 to be an appropriate value. Therefore, no light is emitted from the pnpn devices 28, 30, 32 and 34, among which lights are emitted from the turned-on pnpn devices by supplying external light energy, while no light is emitted from the turned-off pnpn devices, because externally supplied light energy is absorbed therein.

Next, operation of the optical matrix switch, shown in FIGS. 2 and 3, will be explained. When the pnpn devices 28 and 34 are on state and the pnpn devices 30 and 32 are off state, an input light supplied to the input terminal $IN_3$ is supplied from the output terminal $OUT_3$, and an input light supplied to the input terminal $IN_4$ is supplied from the output terminal $OUT_4$. When the pnpn devices 28 and 34 are off state and the pnpn devices 30 and 32 are on state, an input light supplied to the input terminal $IN_3$ is supplied from the output terminal $OUT_4$, and an input light supplied to the input terminal $IN_4$ is supplied from the output terminal $OUT_3$. When the pnpn devices 28 and 30 are on state and the pnpn devices 32 and 34 are off state, an input light supplied to the input terminal $IN_3$ is supplied from the output terminals $OUT_3$ and $OUT_4$, respectively, as output lights. When the pnpn devices 28 and 30 are off state and the pnpn devices 32 and 34 are on state, an input light supplied to the input terminal $IN_4$ is supplied from the output terminals $OUT_3$ and $OUT_4$, respectively.

In the preferred embodiment, the input light signals $IN_3$ and $IN_4$ may have different wavelengths $\lambda_1$ and $\lambda_2$. In this case, the pnpn devices 28 and 30 have a resonant wavelength $\lambda_1$, and the pnpn devices 32 and 34 have a resonant wavelength $\lambda_2$, so that the output light signals $OUT_3$ and $OUT_4$ may be of wavelength division multiplexed light of the wavelengths $\lambda_1$ and $\lambda_2$.

As described above, according to the preferred embodiment, the optical matrix switch can be fabricated to be small in size, and can operates at high speed, because the pnpn devices 28, 30, 32 and 34 of semiconductor switches are employed therein.

In this embodiment, the optical matrix switch is arranged to have two-inputs and two-outputs, however, the number of inputs and outputs may be increased.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An optical matrix switch, comprising:

plural input light paths, to which one or more input light signals are supplied;

plural output light paths, from which one or more output light signals are supplied to a following stage;

a plural demultiplexing and multiplexing light paths, each of aid plural demultiplexing and multiplexing light paths being coupled by a lattice pattern between a corresponding one of said plural input light paths and a corresponding one of said plural output light paths;

plural optical switching devices each provided on a corresponding one of said plural demultiplexing and multiplexing light paths; and means for controlling said plural optical switching devices to be selectively turned on and off;

wherein one or more optical switching devices which are selectively turned on among said plural optical switching devices emit light signals to be supplied to one or more output light paths of said plural output light paths by receiving and amplifying one or more light signals from one or more input light paths of said plural input light paths, whereby the optical switching devices amplify only light signals having wavelengths assigned thereto; and one or more optical switching devices which are selectively turned off among said plural optical switching devices emit no light signal by receiving and absorbing one or more light signals from one or more input light paths of said plural input light paths.

2. An optical matrix switch, according to claim 1, wherein:

each of said plural optical switching devices, comprises:

a semiconductor active layer having a predetermined bandgap energy for emitting light by current injected thereto;

semiconductor cladding layers for sandwiching said semiconductor active layer, said semiconductor cladding layers each having a bandgap energy greater than that of said semiconductor active layer, thereby providing a double-hereto structure; and first and second pn layers provided on both surfaces of said double-hereto structure;

wherein said control means controls each of said one or more optical switching devices which are selectively turned on to be injected by said current which is lower in level than a threshold value.

3. An optical matrix switch, according to claim 2, wherein:

said each of said plural optical switching devices, further comprises;

an n-mirror layer provided on said first pn layer; and a p-mirror layer provided on said second pn layer.

4. An optical matrix switch, according to claim 1, wherein:

said one or more light signals are light signals of different wave lengths; and said one or more output light signals are wavelength division multiplexed lights of said different wavelengths.

5. An optical matrix switch, according to claim 4, wherein:

said plural optical switching devices have different resonant wavelengths corresponding to said input light signals of said different wavelengths.

* * * * *